(12) United States Patent
Bedeschi

(10) Patent No.: US 9,947,687 B2
(45) Date of Patent: Apr. 17, 2018

(54) MEMORY CELLS COMPRISING A PROGRAMMABLE FIELD EFFECT TRANSISTOR HAVING A REVERSIBLY PROGRAMMABLE GATE INSULATOR

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 15/176,624

(22) Filed: Jun. 8, 2016

(65) Prior Publication Data

US 2017/0358598 A1 Dec. 14, 2017

(51) Int. Cl.
| | |
|---|---|
| *G11C 15/00* | (2006.01) |
| *H01L 27/11597* | (2017.01) |
| *H01L 29/78* | (2006.01) |
| *H01L 27/1159* | (2017.01) |
| *H01L 27/11587* | (2017.01) |
| *H01L 29/423* | (2006.01) |

(52) U.S. Cl.
CPC .... *H01L 27/11597* (2013.01); *H01L 27/1159* (2013.01); *H01L 27/11587* (2013.01); *H01L 29/4238* (2013.01); *H01L 29/7827* (2013.01); *H01L 29/78391* (2014.09); *H01L 29/42392* (2013.01)

(58) Field of Classification Search
CPC .... G11C 16/10; G11C 16/0483; H01L 27/115

USPC ........................................ 365/185.05, 185.17
See application file for complete search history.

(56) References Cited

U.S. PATENT DOCUMENTS

| | | | |
|---|---|---|---|
| 6,975,531 B2 | 12/2005 | Forbes | |
| 2002/0131304 A1* | 9/2002 | Ogura | G11C 16/10 365/185.28 |
| 2004/0046210 A1* | 3/2004 | Kang | H01L 21/28282 257/351 |
| 2004/0061153 A1 | 4/2004 | Misewich et al. | |

(Continued)

OTHER PUBLICATIONS

U.S. Appl. No. 15/134,221, filed Apr. 20, 2016, Ramaswamy et al.

(Continued)

*Primary Examiner* — Huan Hoang
(74) *Attorney, Agent, or Firm* — Wells St. John P.S.

(57) ABSTRACT

A memory cell comprises an elevationally extending programmable field effect transistor comprising a gate insulator that is reversibly programmable into two programmable states characterized by two different $V_t$'s of the programmable transistor. The programmable transistor comprises a top source/drain region and a bottom source/drain region. A bottom select device is electrically coupled in series with and elevationally inward of the bottom source/drain region of the programmable transistor. A top select device is electrically coupled in series with and is elevationally outward of the top source/drain region of the programmable transistor. A bottom select line is electrically coupled in series with and is elevationally inward of the bottom select device. A top select line is electrically coupled in series with and is elevationally outward of the top select device. Other embodiments are disclosed.

15 Claims, 13 Drawing Sheets

(56) References Cited

U.S. PATENT DOCUMENTS

| | | | | |
|---|---|---|---|---|
| 2006/0114719 A1* | 6/2006 | Lee | ............... | G11C 16/04 |
| | | | | 365/185.17 |
| 2009/0003062 A1* | 1/2009 | Park | ............ | G11C 16/0483 |
| | | | | 365/185.05 |
| 2014/0340952 A1 | 11/2014 | Ramaswamy et al. | | |
| 2015/0041873 A1 | 2/2015 | Karda et al. | | |
| 2015/0310905 A1 | 10/2015 | Karda et al. | | |
| 2016/0247932 A1* | 8/2016 | Sakai | ............... | C23C 16/40 |

OTHER PUBLICATIONS

Boscke et al.; Ferroelectricity in Hafnium Oxide: CMOS compatible Ferroelectric Field Effect Transistors; IEDM11-547; 2011; pp. 24.5.1-24.5.4.

Colinge et al.; Nanowire transistors without junctions; Nature Nanotechnology; Feb. 21, 2010; pp. 225-229.

Ishiwara, H.; Current status and prospects of FET-type ferroelectric memories; FED Journal vol. 11 Supplement; 2000 pp. 27-40.

* cited by examiner

Write High $V_t$
$V_w = -2.5V$

Write Low $V_t$
$V_w = 2.5$

Read

MEMORY CELLS COMPRISING A PROGRAMMABLE FIELD EFFECT TRANSISTOR HAVING A REVERSIBLY PROGRAMMABLE GATE INSULATOR

TECHNICAL FIELD

Embodiments disclosed herein pertain to memory cells comprising a programmable field effect transistor having a reversibly programmable gate insulator.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate. Transistors other than field effect transistors, for example bipolar transistors, may additionally or alternately be used in memory cells. Transistors may be used in many types of memory. Further, transistors may be used and formed in arrays other than memory.

One type of transistor is a ferroelectric field effect transistor (FeFET) wherein at least some portion of the gate construction (e.g., the gate insulator) comprises ferroelectric material. Such materials are characterized by two stable polarized states. These different states in field effect transistors may be characterized by different threshold voltage ($V_t$) for the transistor or by different channel conductivity for a selected operating voltage. Polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization.

DETAILED DESCRIPTION OF EXAMPLE EMBODIMENTS

Figure 1:
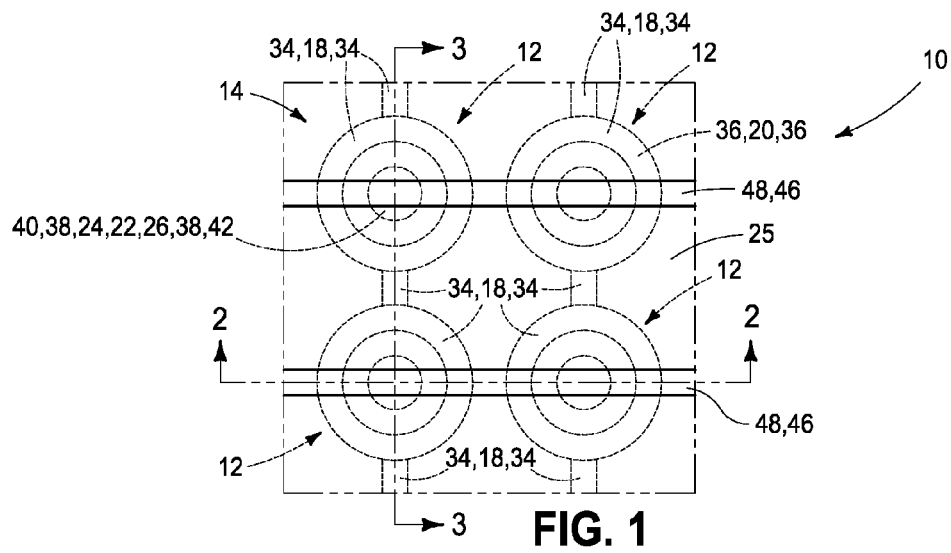
FIG. 1 is a diagrammatic top view of four memory cells in accordance with an embodiment of the invention.

Embodiments of the invention encompass a memory cell, including an array of such memory cells. First embodiment memory cells are shown and described with reference to FIGS. 1-3. A construction 10 comprises four memory cells 12 that have been fabricated relative to a base substrate 11, which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Various materials have been formed as an elevational stack over base substrate 11. Materials may be aside, elevationally inward, or elevationally outward of the FIGS. 1-3-depicted materials. For example, other partially or wholly fabricated components of integrated circuitry may be provided somewhere about or within construction 10. Substrate 11 may comprise any one or more of conductive/conductor/conducting (i.e., electrically herein), semiconductive, or insulative/insulator/insulating (i.e., electrically herein) material(s). Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Memory cells 12 have been fabricated relative to a memory array or memory array area 14. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Only a portion of array 14 is shown having four memory cells 12 therein. Hundreds, thousands, or more memory cells would likely be fabricated within array 14. The discussion largely proceeds with reference to attributes associated with a single memory cell 12.

An individual memory cell 12 comprises an elevationally extending programmable field effect transistor 16. In this document, "elevationally extending" refers to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document unless otherwise stated, "elevational(ly)", "higher", "upper", "lower", "top", "atop", "bottom", "above", "below", "under", and "beneath" are generally with reference to the vertical direction. Also, "elevationally extending" with respect to a field effect transistor is with reference to orientation of the transistor's channel length along which current flows in operation between the source/drain regions. Elevationally extending programmable transistor 16 comprises a conductive gate 18, a gate insulator 20, a channel region 22, a top source/drain region 24, and a bottom source/drain region 26. Any suitable conductive materials may be used for gate 18, for example any one or more of conductively doped semiconductive materials, one or more elemental metal(s), an alloy of two or more elemental metals, and conductive metal compounds. Channel region 22 may comprise any suitably doped semiconductor material as may top and bottom source/drain regions 24, 26, respectively, with suitably doped polysilicon or germanium being examples. An example source/drain region doping with conductivity enhancing impurity(ies) is peak p-type or n-type doping of at least $1 \times 10^{20}$ atoms/cm$^3$ to render the source/drain regions inherently electrically conductive, with the peak channel doping being sufficiently less to not be inherently conductive. In some embodiments, elevationally extending transistor 16 is vertical or within 10° of vertical.

Gate insulator 20 is reversibly programmable into two (i.e., at least two) programmable states characterized by two (i.e., at least two) different threshold voltages ($V_t$) of programmable transistor 16. One ideal gate insulator material is programmable ferroelectric insulator material. Example ferroelectric insulator materials include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ and $Hf_xZr_yO_z$. Another example such gate insulator material is non-ferroelectric programmable charge-trapping insulator material, for example silicon nitride and other materials used as programmable material in charge trap flash transistors.

Memory cell 12 comprises a bottom select device 30 electrically coupled in series (i.e., electrical) with and elevationally inward of bottom source/drain region 26 of programmable transistor 16. Reference to "elevationally inward" with respect to the bottom select device only requires that some portion of such be lower than bottom source/drain region 26, with the bottom select device and programmable transistor perhaps elevationally overlapping or sharing a feature (e.g., an example feature being a source/drain region as explained below). In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. Memory cell 12 includes a top select device 32 electrically coupled in series with and elevationally outward of top source/drain region 24 of programmable transistor 16. Reference to "elevationally outward" with respect to the top select device only requires that some portion of such be higher than top source/drain region 24, with the top select device and programmable transistor perhaps elevationally overlapping or sharing a feature.

Figure 2:
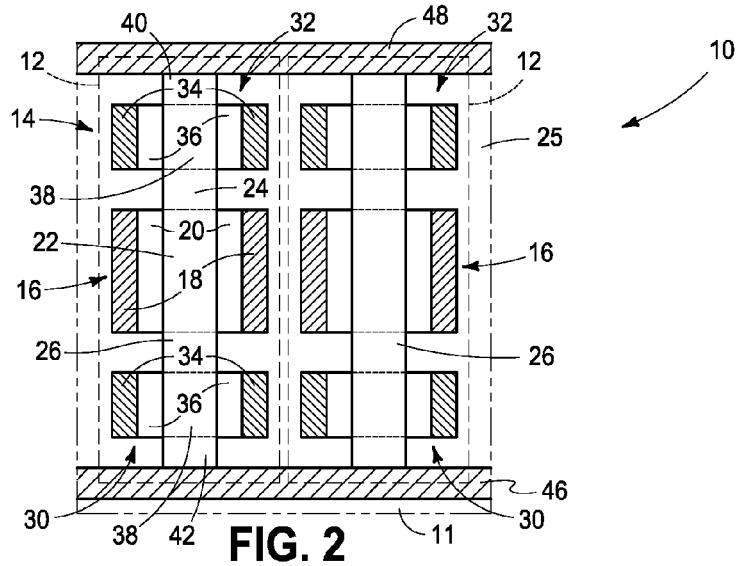
FIG. 2 is a sectional view taken through line 2-2 in FIG. 1.
Figure 3:
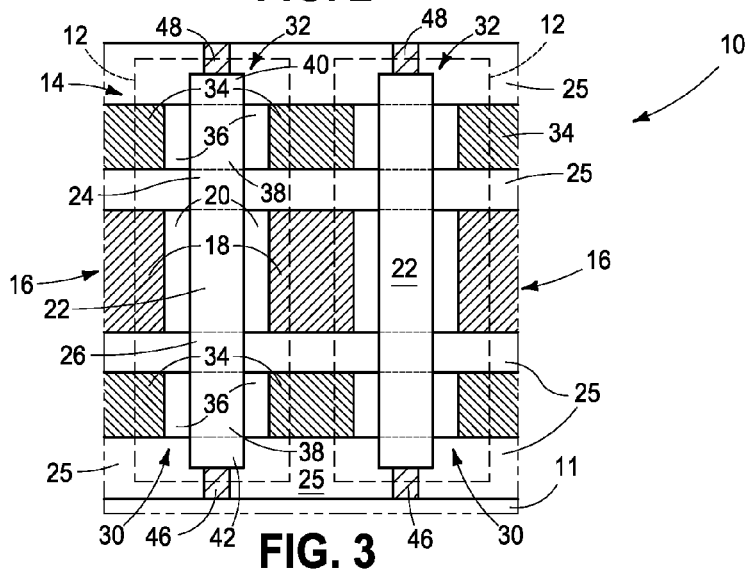
FIG. 3 is a sectional view taken through line 3-3 in FIG. 1.
Figure 4:
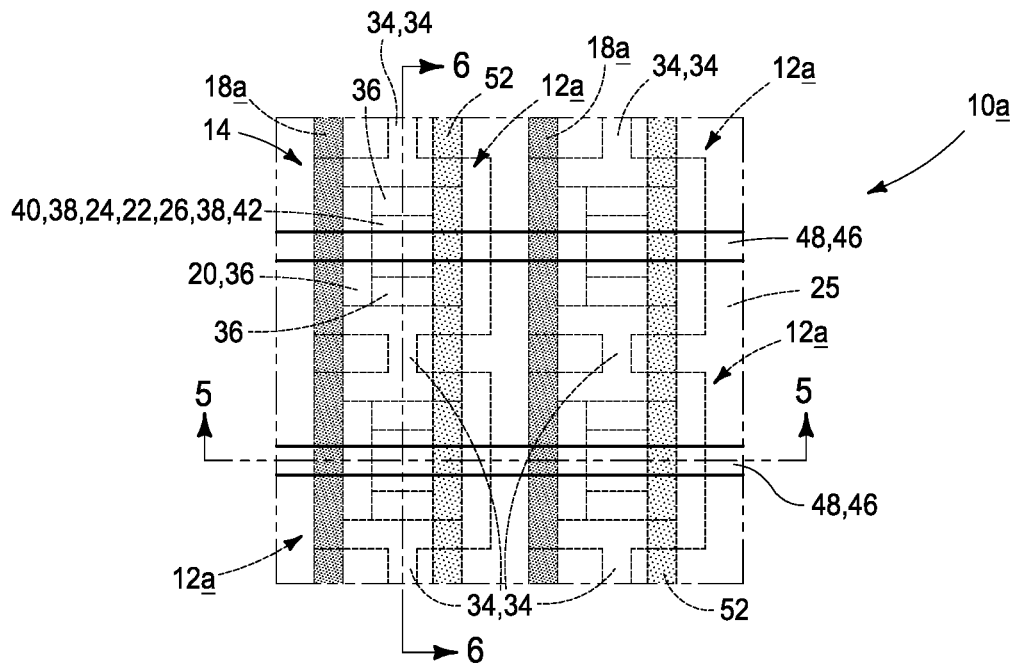
FIG. 4 is a diagrammatic top view of four memory cells in accordance with an embodiment of the invention.
Figure 5:
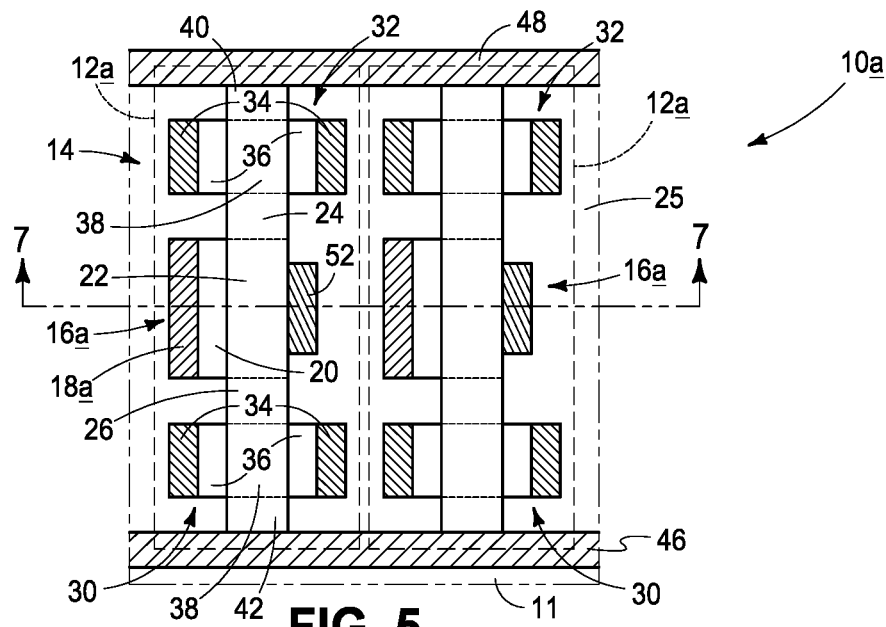
FIG. 5 is a sectional view taken through line 5-5 in FIG. 4.
Figure 6:
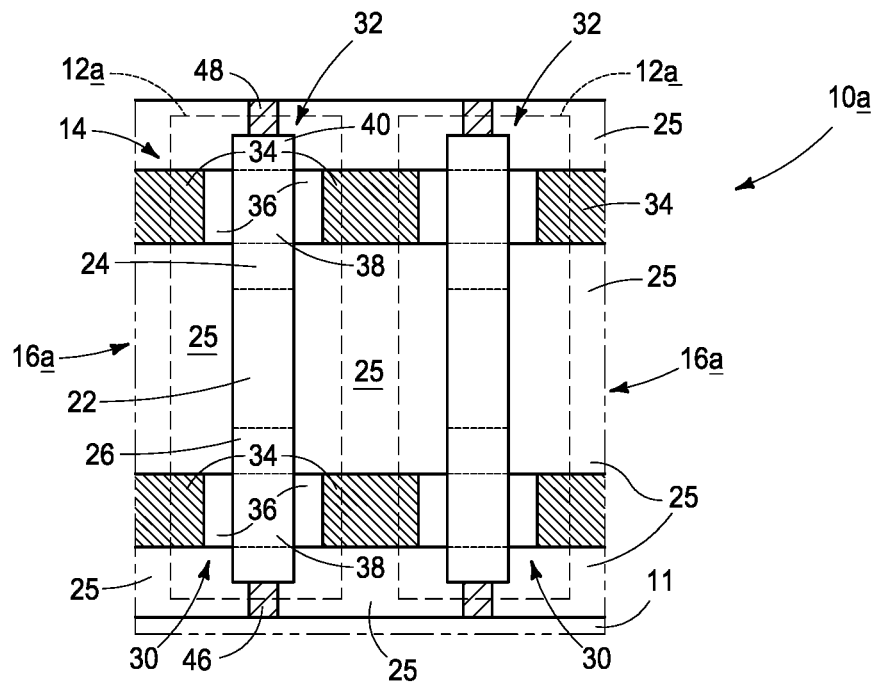
FIG. 6 is a sectional view taken through line 6-6 in FIG. 4.
Figure 7:
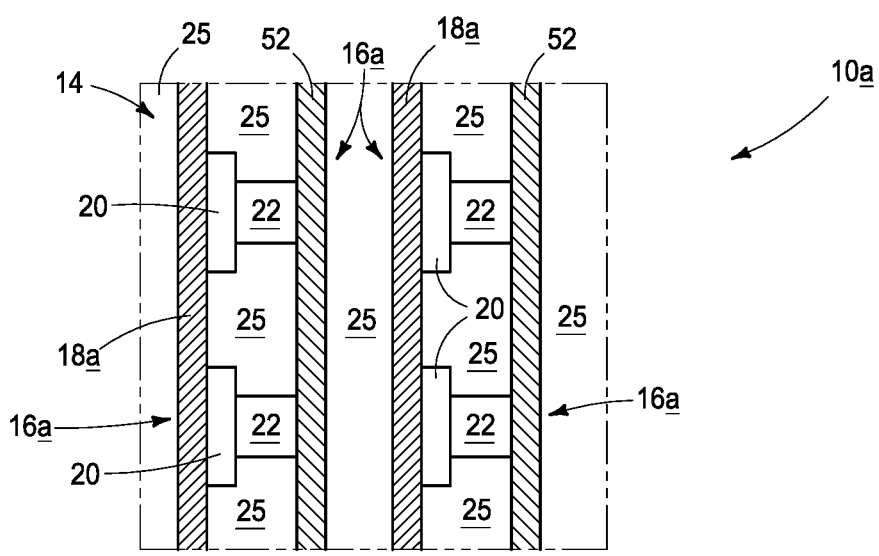
FIG. 7 is a sectional view taken through line 7-7 in FIG. 5.
Figure 8:
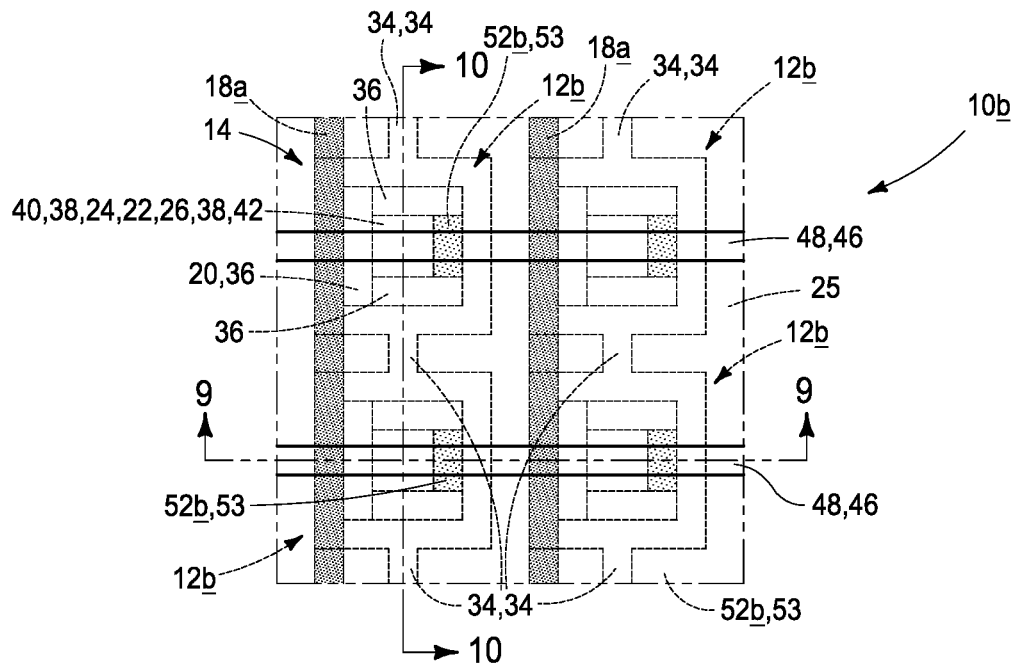
FIG. 8 is a diagrammatic top view of four memory cells in accordance with an embodiment of the invention.
Figure 9:
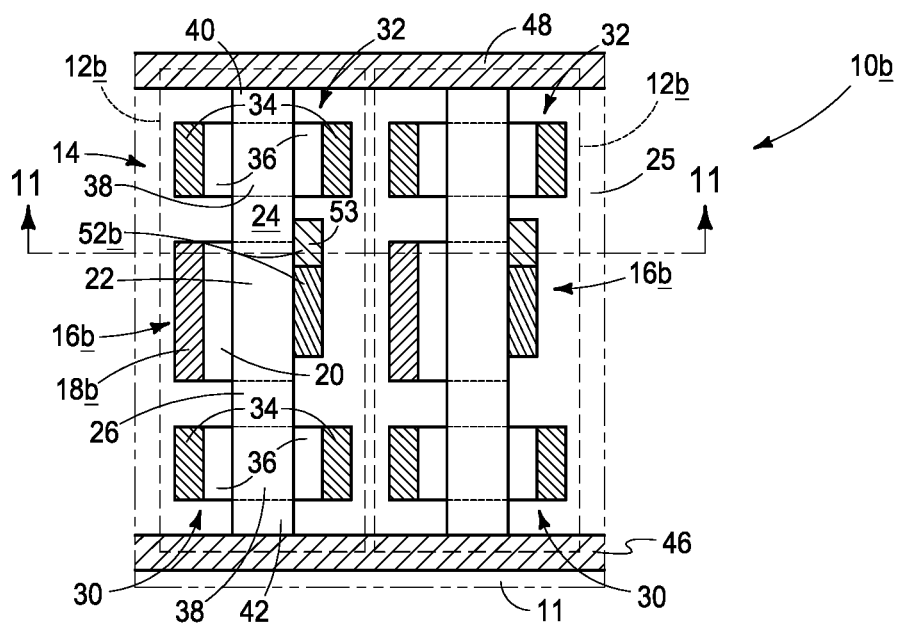
FIG. 9 is a sectional view taken through line 9-9 in FIG. 8.
Figure 10:
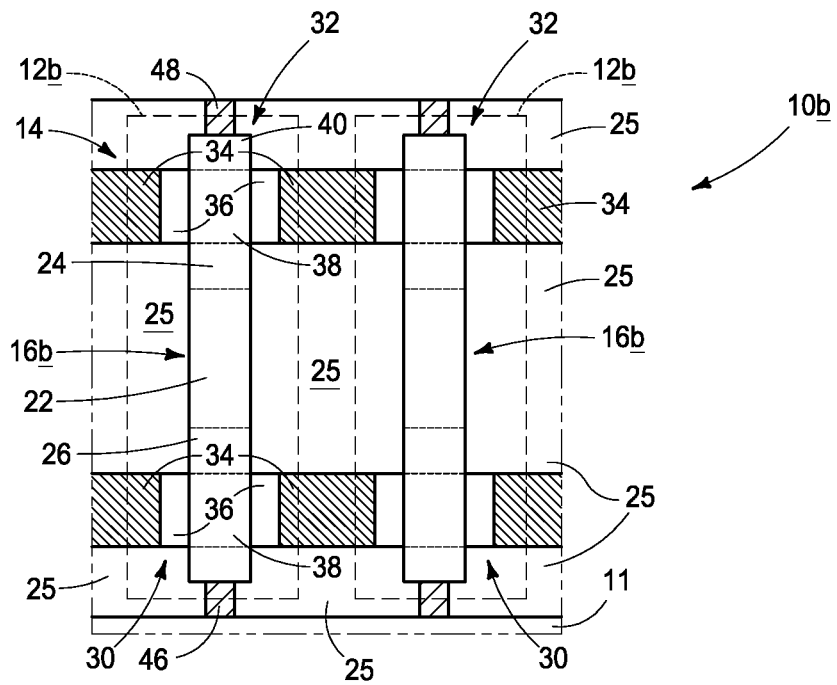
FIG. 10 is a sectional view taken through line 10-10 in FIG. 8.
Figure 11:
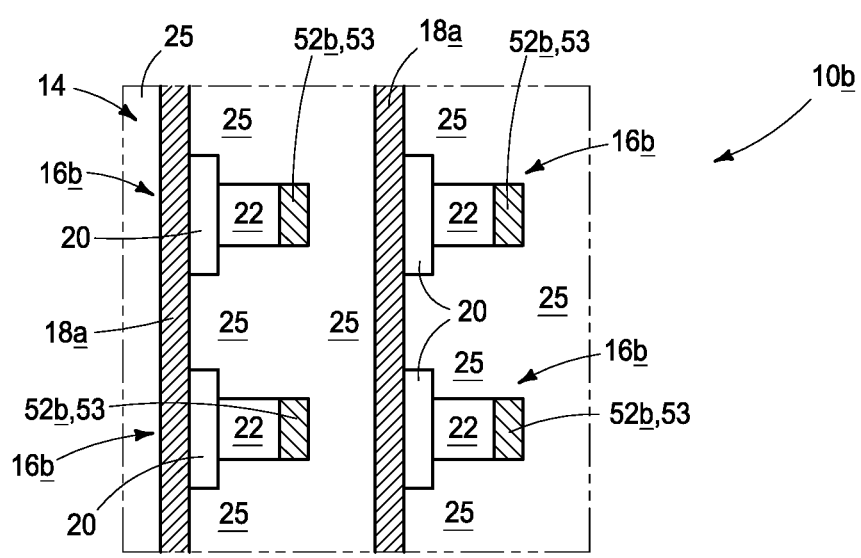
FIG. 11 is a sectional view taken through line 11-11 in FIG. 9.

The bottom select device and the top select device may be of two different type electrical components (not shown) or may be of the same type electrical component (as shown). In one embodiment and as shown, bottom select device 30 and top select device 32 are the same type electrical component, with FIGS. 1-3 showing such component type to be a field effect transistor and which in one embodiment is non-programmable. The field effect transistors of bottom select device 30 and top select device 32 comprise conductive gates 34, a gate insulator 36 (e.g., homogenous silicon dioxide if non-programmable), and a channel region 38.

Bottom field effect transistor 30 comprises a top source/drain region 26 and a bottom source/drain region 42. Top field effect transistor 32 comprises a top source/drain region 40 and a bottom source/drain region 24. Accordingly and in one embodiment, source/drain region 26 comprises a shared source/drain region of programmable transistor 16 and bottom transistor 30 (e.g., a shared feature) thereby electrically coupling bottom transistor 30 and programmable transistor 16 in series with one another. Analogously, source/drain region 24 comprises a shared source/drain region electrically coupling top transistor 32 and programmable transistor 16 in series with one another.

Any of transistors 32, 16, and 30 (i.e., individually and/or collectively) may be a junction transistor or a junction-less transistor.

An example lateral thickness for conductive material of each of gates 18 and 34 is 50 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. An example elevational thickness for each of gates 18 and 34 is 1,000 to 1,500 Angstroms. An example lateral thickness for material of programmable gate insulator 20 is from 200 to 250 Angstroms, with an example elevational thickness being the same as that of gate 18. One more specific example for programmable gate insulator 20 is a 10 to 50 Angstroms laterally thick layer of $SiO_2$ proximate channel region 22 and a 200 Angstroms laterally thick layer of ferroelectric $HfO_2$ immediately radially outward thereof. An example lateral thickness for material of gate insulator 36 is from 10 to 50 Angstroms (for non-programmable), with an example elevational thickness being the same as that of gate 34. Lateral and elevational thicknesses of the gate insulators and the conductive gates of transistors 32, 16, and 30 are shown to be the same for convenience and clarity in the drawings, although such need not be so. An example elevational thickness for each of source/drain regions 40, 24, 26, and 42 is 1,000 Angstroms to 1,500 Angstroms, and such need not be of the same elevational thickness.

In one embodiment and as shown, conductive gates 34 and gate insulator 36 of top and bottom transistors 32, 30, respectively, completely encircle their respective channel regions 38. In one embodiment and as shown, conductive gate 18 and programmable gate insulator 20 completely encircle channel region 22. An example diameter for each channel region 38 and 22, and for each source/drain region 40, 24, 26, and 42, is from 300 Angstroms to 500 Angstroms. The pillar from which such channel regions and source/drain regions have been formed is shown as being circular in horizontal cross-section, although any alternate shape(s) may be used.

Memory cell 12 comprises a bottom select line 46 electrically coupled, and in one embodiment directly electrically coupled, in series with and elevationally inward of bottom transistor/select device 30. Reference to "elevationally inward" with respect to bottom select line 46 only requires that some portion of such be lower than bottom select device 30, with the bottom select line and bottom select device perhaps elevationally overlapping (not shown) or the bottom select line forming some portion of the bottom select device (not shown). Memory cell 12 includes a top select line 48 electrically coupled, and in one embodiment directly electrically coupled, in series with and elevationally outward of top transistor/select device 32. Reference to "elevationally outward" with respect to top select line 48 only requires that some portion of such be higher than top select device 32, with the top select line and top select device perhaps elevationally overlapping (not shown) or the top select line forming some portion of the top select device (not shown). Dielectric 25 (e.g., silicon dioxide and/or silicon nitride) is shown about the various features elevationally between and about bottom select line 46 and top select line 48.

An alternate embodiment memory cell 12a is shown with respect to a construction 10a in FIGS. 4-7. Like numerals from the above-described embodiments have been used where appropriate, with some construction differences being indicated with the suffix "a" or with different numerals. Channel region 22 of programmable transistor 16a and channel region 38 of top and bottom transistors 30, 32, respectively, are shown as being square or rectangular in horizontal cross-sections for clarity in the figures, although such would more likely be circular and regardless may be of any other shape in horizontal cross-section. Accordingly in FIGS. 4-7, many of the transistor features radially outward of channel regions 22 and 38 are shown as having portions extending along straight horizontal lines in horizontal cross-section, whereas the embodiments of FIG. 1 show analogous such components as extending along arc or semi-circle segments in horizontal cross-section due to the circular-depicted horizontal cross sections of the channels. Regardless, in the embodiments of FIGS. 4-7, conductive gate 18a does not completely encircle channel region 22, and in one embodiment as shown programmable gate insulator 20 also does not completely encircle channel region 22a. In one embodiment, a conductive electrode 52 is directly against channel region 22 at a circumferential location where conductive gate 18a is not encircling over channel region 22a, and in one embodiment as shown with gate 18a and electrode 52 being diametrically opposed with respect to one another. Conductive material of electrode 52 may be of any suitable composition as described above with respect to conductive gate 18. Conductive electrode 52 may extend as an elongated line parallel diametrically opposed gate line 18a to be directly against multiple channels 22 of different programmable transistors 16a, for example as shown. In operation, conductive electrode 52 may be provided at a suitable potential (e.g., positive, negative, or ground) to prevent voltage of channel region 22 from floating during operation. FIGS. 1-3 illustrate an example embodiment where no electrode is directly against channel region 22, whereby such channel region of programmable transistor 16 may have floating voltage in operation. Regardless, any other attribute(s) or aspect(s) as shown and/or described above may be used.

FIGS. 4-7 illustrate an embodiment wherein electrode 52 does not extend to be directly against either of top source/drain region 24 or bottom source/drain region 26 of programmable transistor 16. Alternately, in one embodiment, the electrode may extend to be directly against only one of the top source/drain region or the bottom source/drain region of the programmable transistor, for example as shown in an embodiment of a construction 10b in FIGS. 8-11. Like numerals from the above-described embodiments have been used where appropriate, with some construction differences being indicated with the suffix "b" or with different numerals. Specifically, conductive electrode 52b of programmable transistor 16b is shown extending to be directly against top source/drain region 24, and by way of example only is shown as comprising a conductive extension 53 of different composition conductive material from that of material immediately there-below. Alternately such may be of the same material and, for example, be homogenous. Regardless, while FIGS. 8-11 show electrode 52b extending to be directly against top source/drain region 24, such may alternately extend to be directly against only bottom source/drain region 26. Regardless, such a construction might be used to prevent channel voltage from floating during operation as always being tied to one source/drain voltage. Any other attribute(s) or aspect(s) as shown and/or described above may be used.

Figure 12:
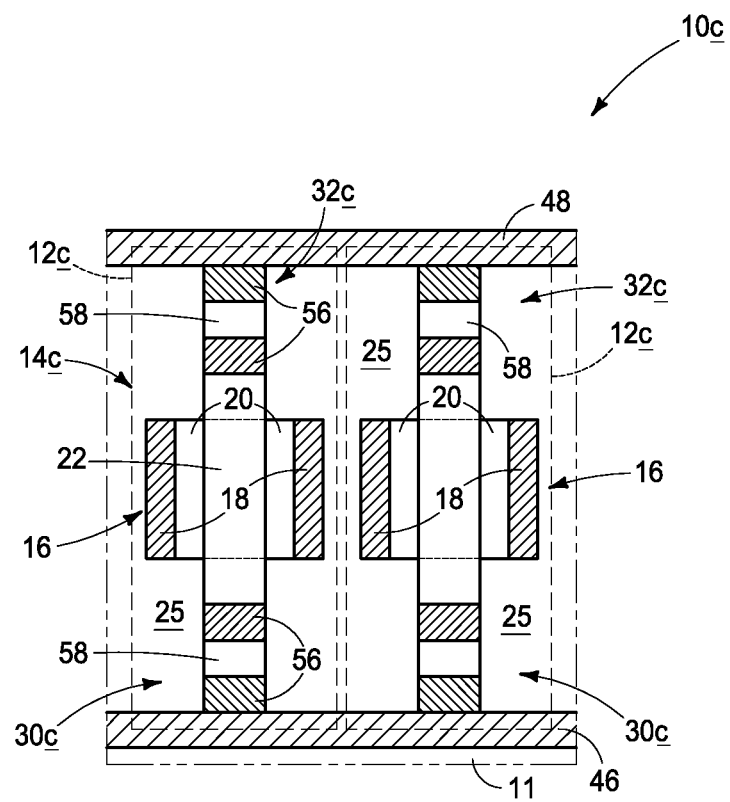
FIG. 12 is a diagrammatic sectional view of two memory cells in accordance with an embodiment of the invention.
Figure 13:
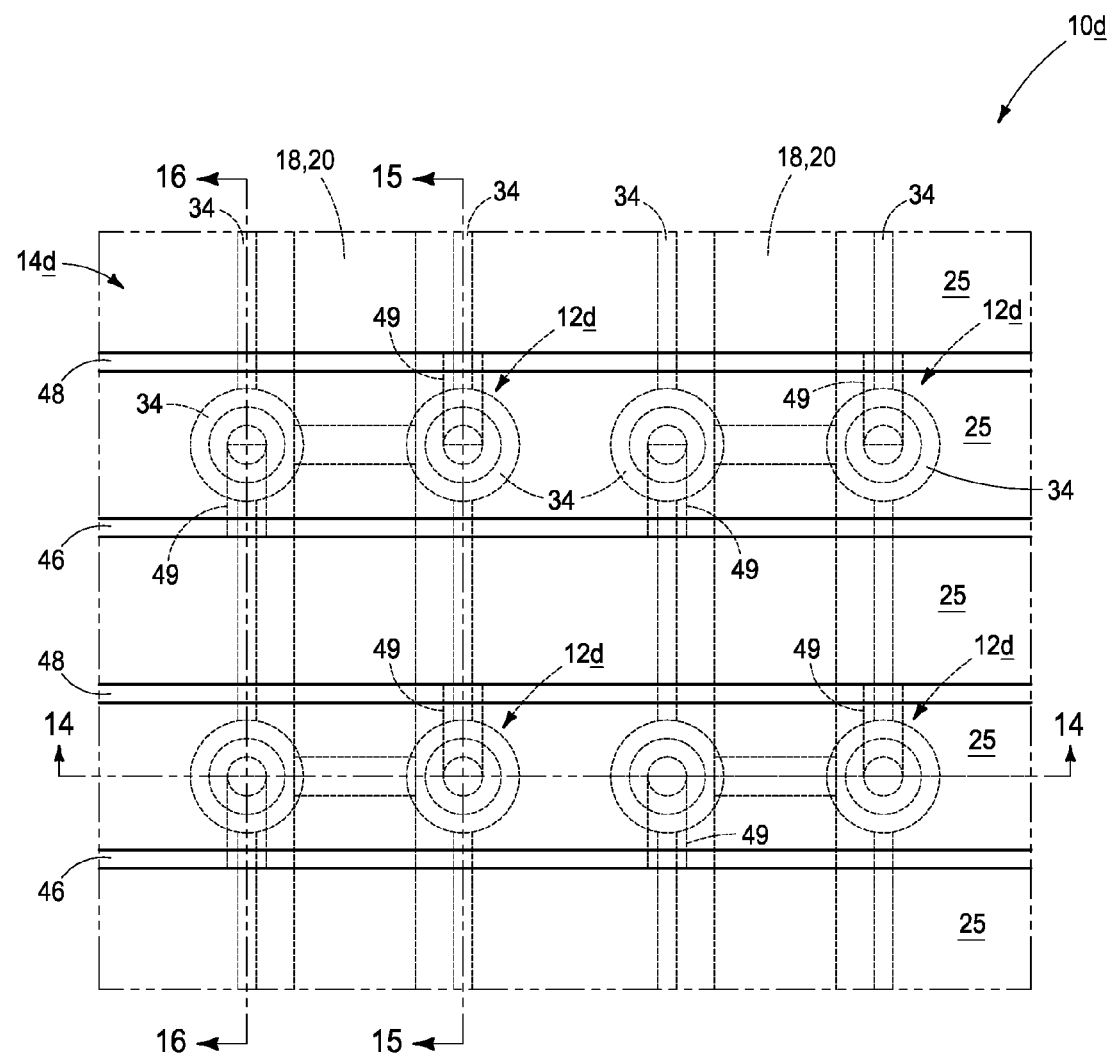
FIG. 13 is a diagrammatic top view of four memory cells in accordance with an embodiment of the invention.
Figure 14:
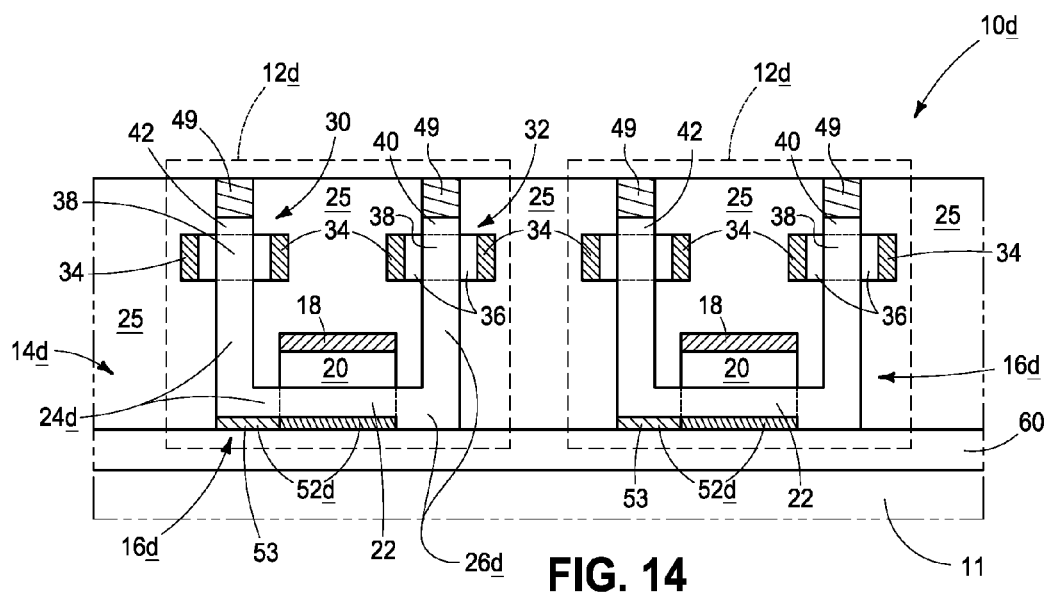
FIG. 14 is a sectional view taken through line 14-14 in FIG. 13.
Figure 15:
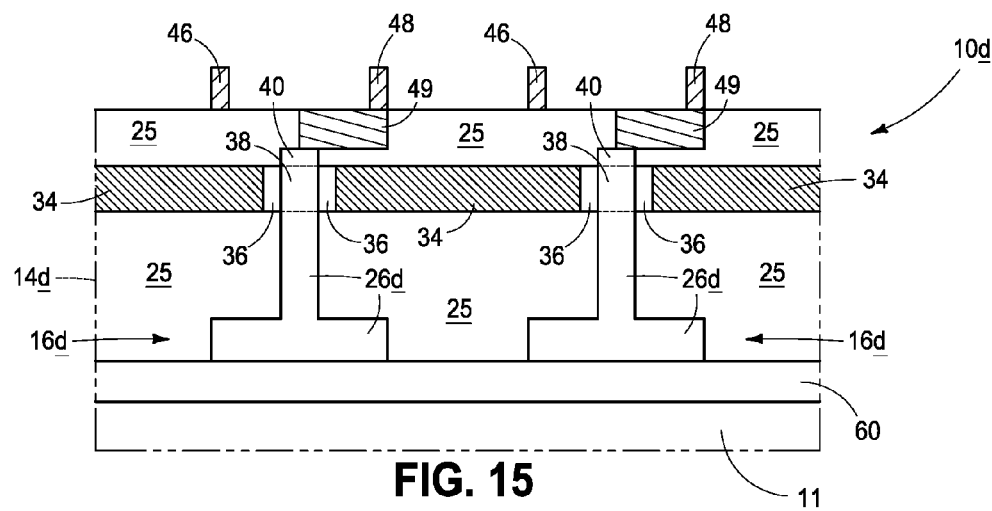
FIG. 15 is a sectional view taken through line 15-15 in FIG. 13.
Figure 16:
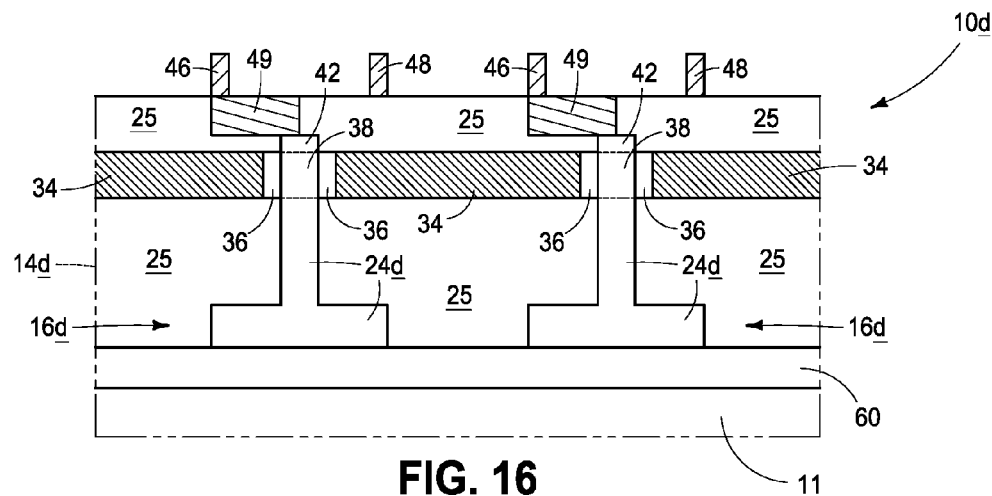
FIG. 16 is a sectional view taken through line 16-16 in FIG. 13.

FIG. 12 shows an alternate embodiment construction 10c comprising a memory cell 12c in comparison to FIG. 2 of the FIGS. 1-3 construction. Like numerals from the above-described embodiments have been used where appropriate, with some construction differences being indicated with the suffix "c" or with different numerals. Memory cell 12c is shown as comprising a top select device 32c and a bottom select device 30c each being in the form of a diode individually comprising opposing conductive electrodes 56 having a material 58 there-between. By way of example, material 58 may comprise suitable semiconductive material such as doped or undoped silicon, thereby forming an MSM diode, or alternately may comprise opposing insulator layers (e.g., $Al_2O_3$) having semiconductor material there-between forming an MISIM diode. Other diodes and non-diodes may be used for the top and bottom select devices. In one embodiment, one of the top or bottom select device is a diode and the other of the top and bottom select device is a field effect transistor (not shown).

An alternate embodiment memory cell 12d of a construction 10d is next described with reference to FIGS. 13-16. Like numerals from the above-described embodiments have been used where appropriate, with some construction differences being indicated with the suffix "d" or with different numerals. Memory cell 12d comprises a horizontally extending programmable field effect transistor 16d. In this document, "horizontally extending" refers to a direction that is angled away by less than 45° from the primary surface relative to which the substrate is processed during fabrication. Also, "horizontally extending" with respect to a field effect transistor is with reference to orientation of the channel length along which current flows between the source/drain regions in operation. In some embodiments, horizontally extending transistor 16d is horizontal or within 10° of horizontal. Base substrate 11 may comprise semiconductor material, for example monocrystalline silicon. A dielectric 60 (e.g., silicon dioxide and/or silicon nitride) has been formed over base substrate 11. Gate insulator 20 is again reversibly programmable into two programmable states characterized by two different $V_t$'s of programmable transistor 16d. Programmable transistor 16d comprises one source/drain region 24d on one lateral side of transistor 16c (e.g., FIG. 16 and the left side in FIG. 14) and another source/drain region 26d on another lateral side of programmable transistor 16d (e.g., FIG. 15 and the right side in FIG. 14).

One select device 30 electrically couples, and in one embodiment directly electrically couples, in series with one source/drain region 24d of programmable transistor 16d. Select device 30 is on the same lateral side of programmable transistor 16d as source/drain region 24d and is elevationally outward of programmable transistor 16d. Another select device 32 is electrically coupled, in one embodiment directly electrically coupled, in series with other source/drain region 26d of programmable transistor 16d. Other select device 32 is on the same other lateral side of programmable transistor 16d as source/drain region 26d and is elevationally outward of programmable transistor 16d. One elevationally outer select line 46 is electrically coupled (e.g., directly as shown) in series with and elevationally outward of select device 30. Another elevationally outer select line 48 is electrically coupled (e.g., directly as shown) in series with and elevationally outward of other select device 32. Example conductors 49 are shown directly electrically coupling source/drain regions 40 with select lines 46 and 48, and source/drain regions 42 with select lines 48. In one embodiment, the one and another select devices 30, 32 are at the same elevation relative to one another, for example as shown. In one embodiment, the one and another select lines 46, 48 are at the same elevation relative one another, for example as shown.

Any other attribute(s) or aspect(s) as shown and/or described above may be used. For example and by way of example only, select devices other than field effect transistors may be used in the FIGS. 13-16 embodiments (not shown). Also, the embodiment of FIGS. 13-16 shows an example construction where an electrode 52d is directly against channel region 22 and extends to only one of the source/drain regions (e.g., region 24d) of programmable transistor 16d, although any of the other example embodiments described above may be used.

Figure 17:
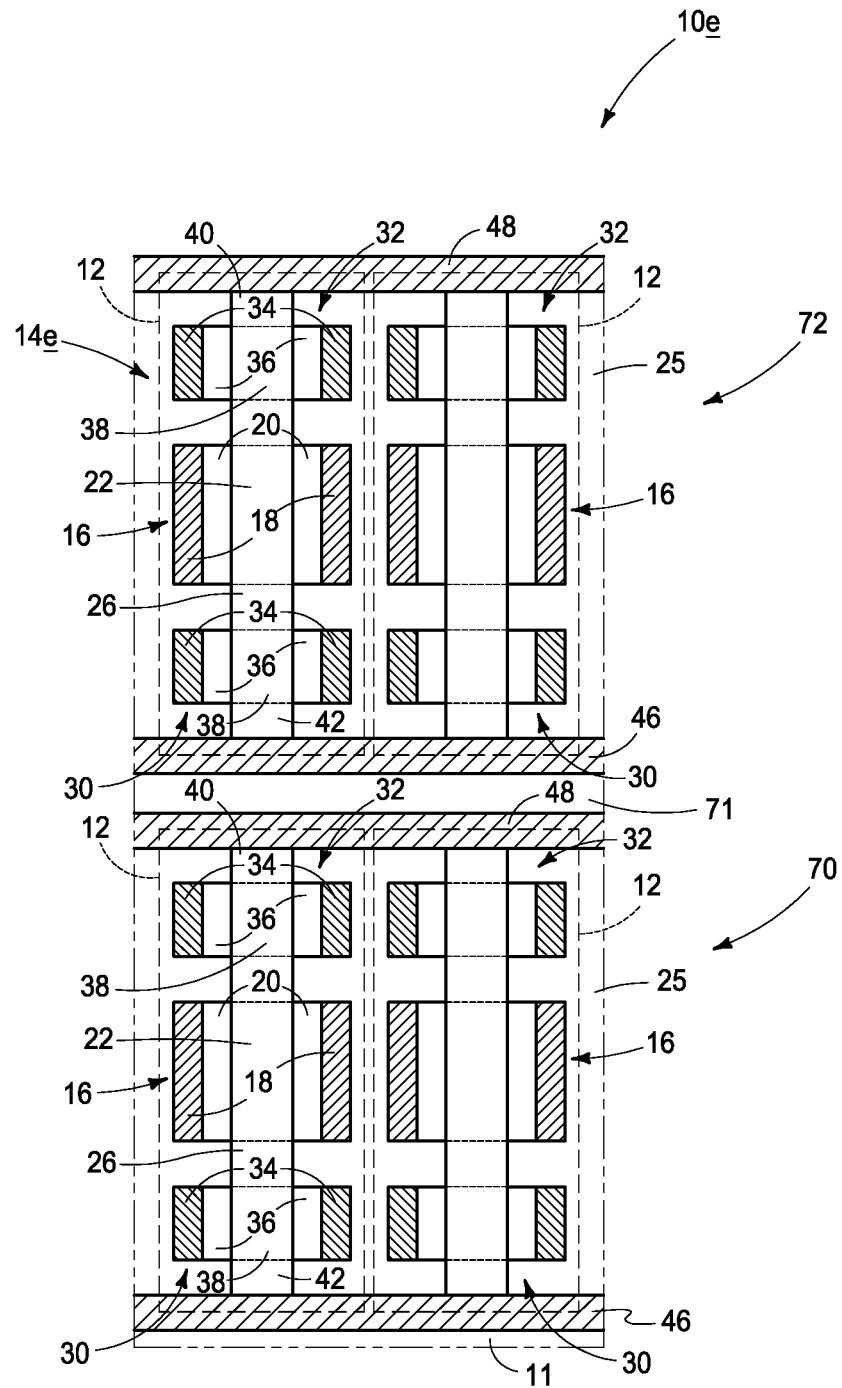
FIG. 17 is a diagrammatic sectional view of four memory cells in accordance with an embodiment of the invention.

An embodiment of the invention also comprises an array of any such memory cells described above. In one such embodiment, such an array comprises at least two decks of such memory cells that are individually elevationally over or under one another, for example as shown in FIG. 17 with respect to a construction 10e. Like numerals from the above-described embodiments have been used where appropriate, with some construction differences being indicated with the suffix "e" or with different numerals. FIG. 17 shows construction analogous to that shown by FIG. 2, although other constructions may be used. FIG. 17 shows an elevationally inner deck 70 and an elevationally outer deck 72 having dielectric material 71 (e.g., silicon dioxide and/or silicon nitride) there-between. Any other attribute(s) or aspect(s) as shown and/or described above may be used.

Figure 18:
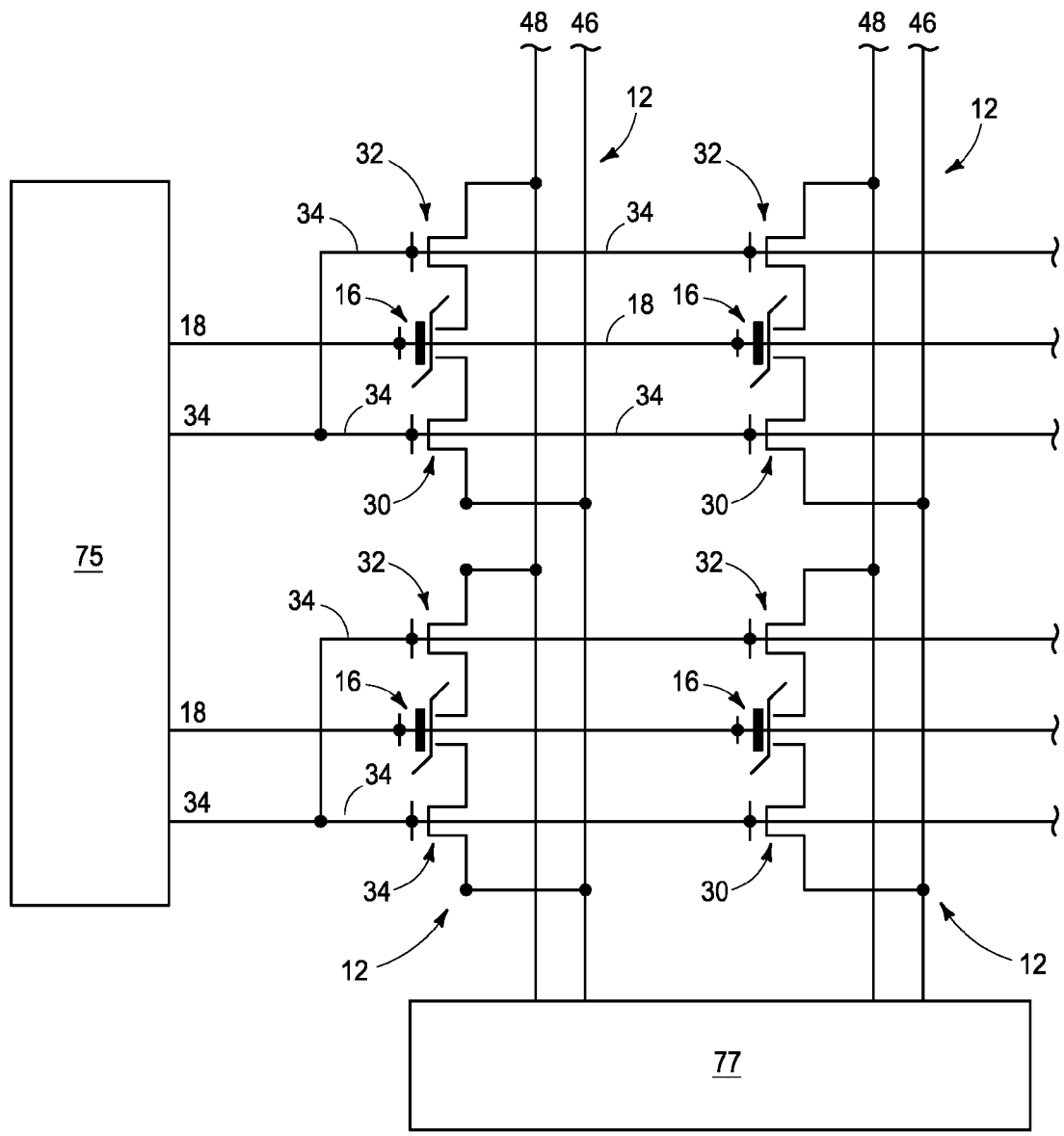
FIG. 18 is a diagrammatic schematic of four memory cells and associated circuitry in accordance with an embodiment of the invention.

FIG. 18 shows an example schematic of the FIGS. 1-3 construction, and as but one example. In one embodiment and as shown, the top and bottom transistors have their respective conductive gates permanently shunted together in the memory cell. Alternately, the top conductive gate and the bottom conductive gate may not be permanently shunted together (not shown). The FIG. 18 schematic shows gates 18 of programmable transistors 16 and gates 34 of select transistors 30, 32 extending to connect with example decoder circuitry 75, with select lines 46 and 48 extending to connect with example sense line decoders, sense amp circuitry, and program circuitry 77. Circuitry 75 and/or circuitry 77 might be under the array or to the side (e.g., laterally peripheral) of the array of memory cells in any of the embodiments.

Figure 21:
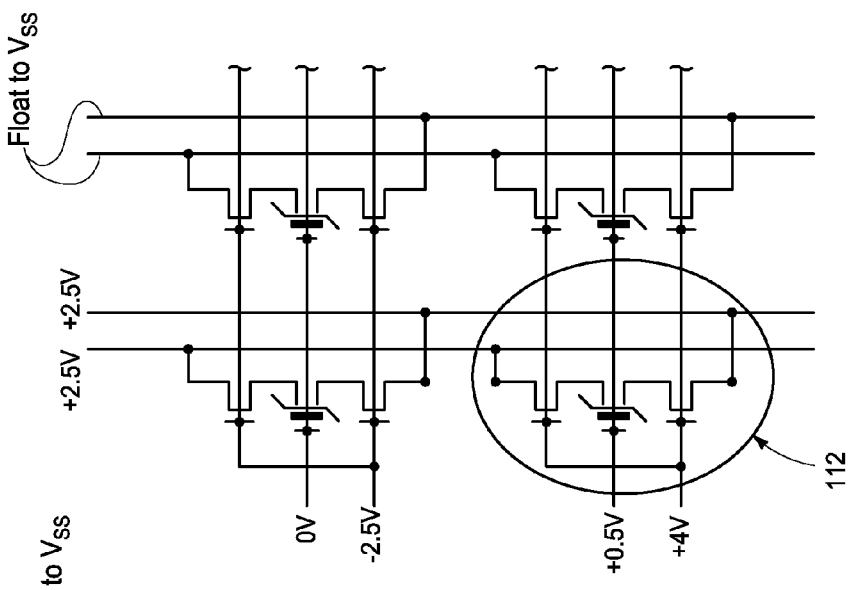
FIG. 21 is a view of a portion of the FIG. 18 schematic configured to write the one memory cell of FIG. 18 into another programmed state that is different from that of FIG. 20.
Figure 20:
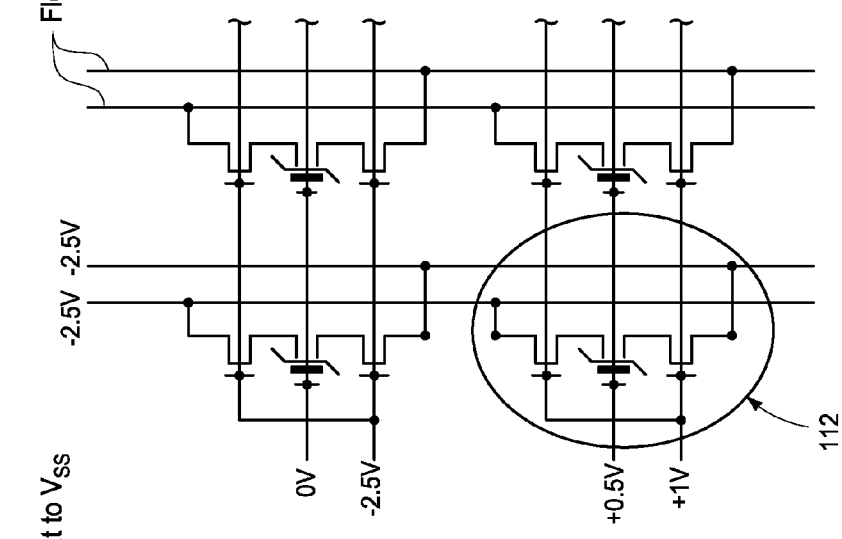
FIG. 20 is a view of a portion of the FIG. 18 schematic configured to write the one memory cell of FIG. 18 into one programmed state.
Figure 19:
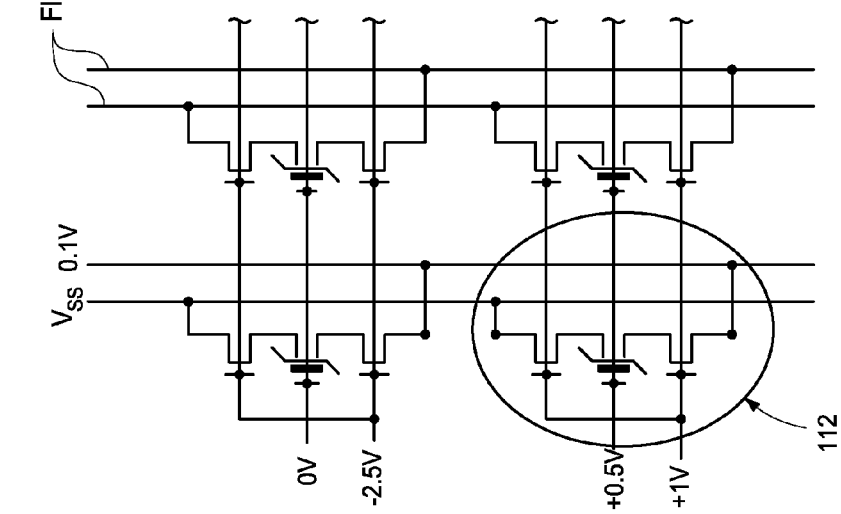
FIG. 19 is a view of a portion of the FIG. 18 schematic configured to read the programmed state of one of the memory cells.

FIG. 19 shows example voltage applications for reading a selected memory cell 112 (e.g., determining the $V_t$ state of the selected memory cell). FIGS. 20 and 21 show example programming voltages to write selected memory cell 112 to a low $V_t$ state (FIG. 20) and to a high $V_t$ state (FIG. 21).

Figure 22:
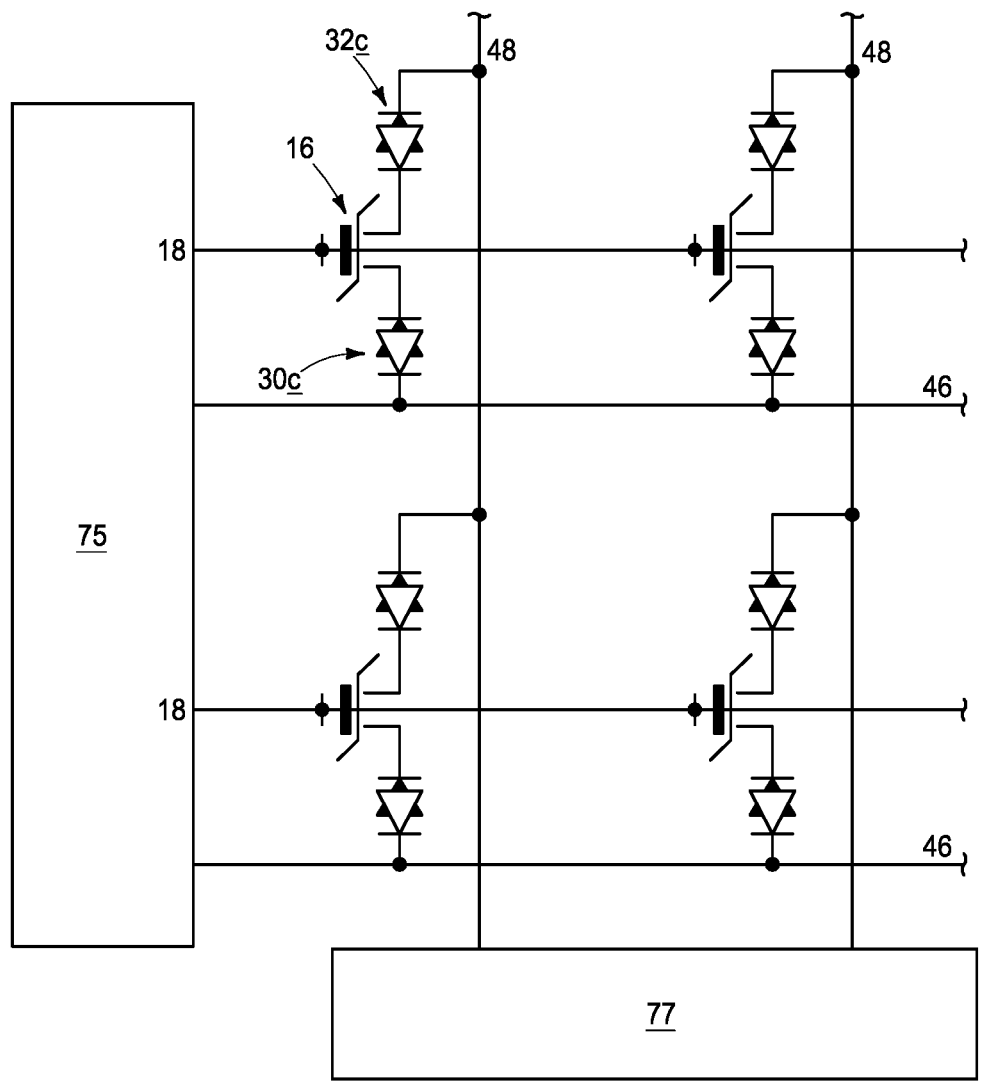
FIG. 22 is a diagrammatic schematic of four memory cells and associated circuitry in accordance with an embodiment of the invention.
Figure 25:
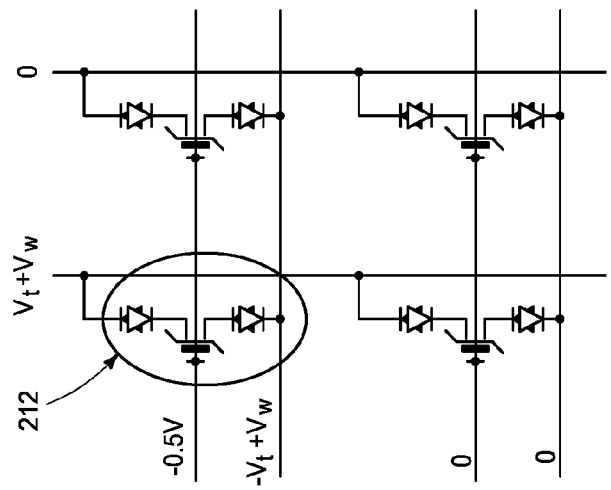
FIG. 25 is a view of a portion of the FIG. 22 schematic configured to write the one memory cell of FIG. 22 into another programmed state that is different from that of FIG. 23.
Figure 24:
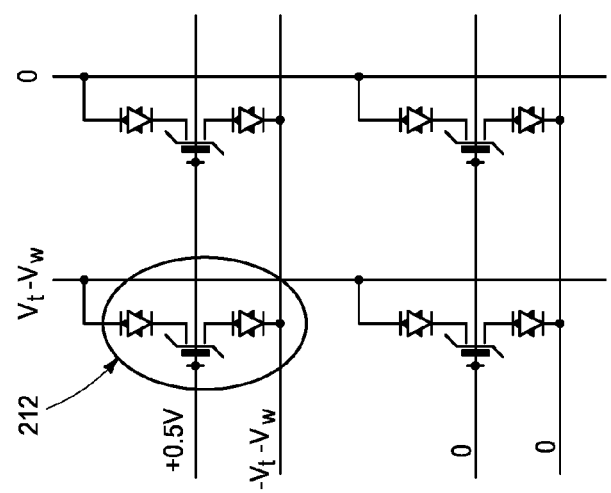
FIG. 24 is a view of a portion of the FIG. 22 schematic configured to write the one memory cell of FIG. 22 into one programmed state.
Figure 23:
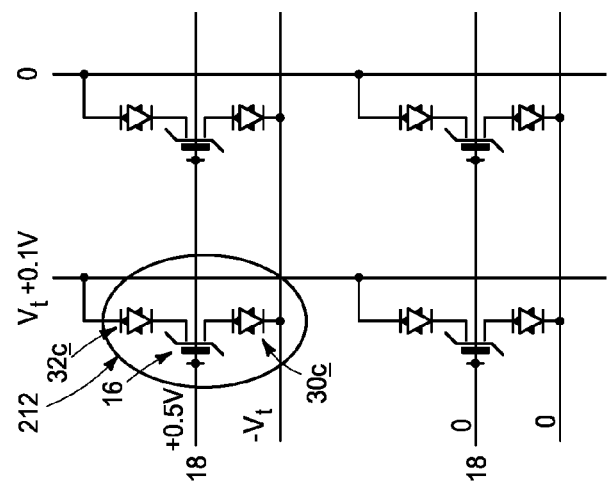
FIG. 23 is a view of a portion of the FIG. 22 schematic configured to read the programmed state of one of the memory cells.

FIG. 22 shows an example schematic of the FIG. 12 construction where the select devices comprise diodes 30c, 32c. FIGS. 23, 24, and 25 show example read and write voltages corresponding to FIGS. 19, 20, and 21, respectively, with respect to a selected memory cell 212.

CONCLUSION

In some embodiments, a memory cell comprises an elevationally extending programmable field effect transistor comprising a gate insulator that is reversibly programmable into two programmable states characterized by two different $V_t$'s of the programmable transistor. The programmable transistor comprises a top source/drain region and a bottom source/drain region. A bottom select device is electrically coupled in series with and is elevationally inward of the bottom source/drain region of the programmable transistor. A top select device is electrically coupled in series with and is elevationally outward of the top source/drain region of the programmable transistor. A bottom select line is electrically coupled in series with and is elevationally inward of the bottom select device. A top select line is electrically coupled in series with and is elevationally outward of the top select device.

In some embodiments, a memory cell comprises an elevationally extending programmable field effect transistor comprising a gate insulator that is reversibly programmable into two programmable states characterized by two different $V_t$'s of the programmable transistor. The programmable transistor comprises a top source/drain region and a bottom source/drain region. A bottom field effect transistor comprises and shares the bottom source/drain region of the programmable transistor thereby electrically coupling the bottom transistor and the programmable transistor in series with one another. A top field effect transistor comprises and shares the top source/drain region of the programmable transistor thereby electrically coupling the top transistor and the programmable transistor in series with one another. A bottom select line is electrically coupled in series with and elevationally inward of the bottom transistor. A top select line is electrically coupled in series with and elevationally outward of the top transistor.

In some embodiments, a memory cell comprises a horizontally extending programmable field effect transistor comprising a gate insulator that is reversibly programmable into two programmable states characterized by two different $V_t$'s of the programmable transistor. The programmable transistor comprises one source/drain region on one lateral side of the programmable transistor and another source/drain region on another lateral side of the programmable transistor that is opposite the one lateral side. One select device is electrically coupled in series with the one source/drain region of the programmable transistor. The one select device is on the one lateral side and is elevationally outward of the programmable transistor. Another select device is electrically coupled in series with the another source/drain region of the programmable transistor. The another select device is on the another lateral side and is elevationally outward of the programmable transistor. One elevationally outer select line is electrically coupled in series with and elevationally outward of the one select device. Another elevationally outer select line is electrically coupled in series with and elevationally outward of the another select device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising:
   a horizontally extending programmable field effect transistor comprising a gate insulator that is reversibly programmable into two programmable states characterized by two different $V_t$'s of the programmable transistor, the programmable transistor comprising one source/drain region on one lateral side of the programmable transistor and another source/drain region on another lateral side of the programmable transistor that is opposite the one lateral side;
   one select device electrically coupled in series with the one source/drain region of the programmable transistor, the one select device being on the one lateral side and elevationally outward of the programmable transistor;
   another select device electrically coupled in series with the another source/drain region of the programmable transistor, the another select device being on the another lateral side and elevationally outward of the programmable transistor, the one select device and the another select device each comprising a diode;
   one elevationally outer select line electrically coupled in series with and elevationally outward of the one select device; and
   another elevationally outer select line electrically coupled in series with and elevationally outward of the another select device.

2. The memory cell of claim 1 wherein the one and another select devices are at the same elevation relative one another.

3. The memory cell of claim 1 wherein the one and another select lines are at the same elevation relative one another.

4. The memory cell of claim 1 wherein the gate insulator comprises programmable ferroelectric insulator material.

5. The memory cell of claim 1 wherein the gate insulator comprises programmable charge trapping insulator material.

6. The memory cell of claim 1 comprising an array of such memory cells.

7. A memory cell, comprising:
   a horizontally extending programmable field effect transistor comprising a gate insulator that is reversibly programmable into two programmable states characterized by two different $V_t$'s of the programmable transistor, the programmable transistor comprising one source/drain region on one lateral side of the programmable transistor and another source/drain region on another lateral side of the programmable transistor that is opposite the one lateral side;
   one select device electrically coupled in series with the one source/drain region of the programmable transistor, the one select device being on the one lateral side and elevationally outward of the programmable transistor;
   another select device electrically coupled in series with the another source/drain region of the programmable transistor, the another select device being on the another lateral side and elevationally outward of the programmable transistor;

one elevationally outer select line electrically coupled in series with and elevationally outward of the one select device;

another elevationally outer select line electrically coupled in series with and elevationally outward of the another select device; and the programmable transistor having a channel region, and further comprising a conductive electrode directly against the channel region, the electrode extending to be directly against only one of the one or another source/drain region of the programmable transistor.

8. The memory cell of claim 7 wherein the one and another select device each comprise an elevationally extending transistor.

9. The memory cell of claim 8 wherein each of the elevationally extending transistors is vertical or within 10° of vertical.

10. The memory cell of claim 8 wherein the horizontally extending programmable field effect transistor is horizontal or within 10° of horizontal.

11. The memory cell of claim 1 wherein A memory cell, comprising:

a horizontally extending programmable field effect transistor comprising a gate insulator that is reversibly programmable into two programmable states characterized by two different $V_t$'s of the programmable transistor, the programmable transistor comprising one source/drain region on one lateral side of the programmable transistor and another source/drain region on another lateral side of the programmable transistor that is opposite the one lateral side;

one select device electrically coupled in series with the one source/drain region of the programmable transistor, the one select device being on the one lateral side and elevationally outward of the programmable transistor;

another select device electrically coupled in series with the another source/drain region of the programmable transistor, the another select device being on the another lateral side and elevationally outward of the programmable transistor;

one elevationally outer select line electrically coupled in series with and elevationally outward of the one select device;

another elevationally outer select line electrically coupled in series with and elevationally outward of the another select device; and the one select device and the another select device are two different type electrical components, one of the two different type electrical components being a field effect transistor, another of the two different type electrical components not being a field effect transistor.

12. A memory cell, comprising:

a horizontally extending programmable field effect transistor comprising a gate insulator that is reversibly programmable into two programmable states characterized by two different $V_t$'s of the programmable transistor, the programmable transistor comprising one source/drain region on one lateral side of the programmable transistor and another source/drain region on another lateral side of the programmable transistor that is opposite the one lateral side;

one select device electrically coupled in series with the one source/drain region of the programmable transistor, the one select device being on the one lateral side and elevationally outward of the programmable transistor;

another select device electrically coupled in series with the another source/drain region of the programmable transistor, the another select device being on the another lateral side and elevationally outward of the programmable transistor;

one elevationally outer select line electrically coupled in series with and elevationally outward of the one select device;

another elevationally outer select line electrically coupled in series with and elevationally outward of the another select device; and the one and another select device are each non-programmable field effect transistors having a respective conductive gate, a respective channel region, and a respective gate insulator there-between; the respective conductive gates and respective gate insulator completely encircling their respective channel regions.

13. A memory cell, comprising:

a horizontally extending programmable field effect transistor comprising a gate insulator that is reversibly programmable into two programmable states characterized by two different $V_t$'s of the horizontally extending programmable transistor, the horizontally extending programmable transistor comprising one source/drain region on one lateral side of the horizontally extending programmable transistor and another source/drain region on another lateral side of the horizontally extending programmable transistor that is opposite the one lateral side;

one elevationally extending field effect transistor comprising and sharing the one source source/drain region of the horizontally extending programmable transistor thereby directly electrically coupling the one elevationally extending field effect transistor and the horizontally extending programmable transistor in series with one another, the one elevationally extending field effect transistor being on the one lateral side and elevationally outward of the horizontally extending programmable transistor;

another elevationally extending field effect transistor comprising and sharing the another source/drain region of the horizontally extending programmable transistor thereby directly electrically coupling the another elevationally extending field effect another transistor and the horizontally extending programmable transistor in series with one another, the another elevationally extending field effect transistor being on the another lateral side and elevationally outward of the horizontally extending programmable transistor;

one elevationally outer select line electrically coupled in series with and elevationally outward of the one elevationally extending field effect transistor; and another elevationally outer select line electrically coupled in series with and elevationally outward of the another elevationally extending field effect transistor.

14. The memory cell of claim 13 wherein the one and another elevationally extending field effect transistor are non-programmable.

15. The memory cell of claim 13 wherein the one and another elevationally extending field effect transistor are vertical or with 10° of vertical.

* * * * *

UNITED STATES PATENT AND TRADEMARK OFFICE
CERTIFICATE OF CORRECTION

PATENT NO. : 9,947,687 B2
APPLICATION NO. : 15/176624
DATED : April 17, 2018
INVENTOR(S) : Ferdinando Bedeschi Page 1 of 1

It is certified that error appears in the above-identified patent and that said Letters Patent is hereby corrected as shown below:

Column 11, Lines 22-23:
Replace "11. The memory cell of claim 1 wherein A memory cell, comprising:"
With "11. A memory cell, comprising:"

Signed and Sealed this
Thirty-first Day of July, 2018

Andrei Iancu
*Director of the United States Patent and Trademark Office*